United States Patent [19]

Ishigaki

[11] 4,442,546
[45] Apr. 10, 1984

[54] NOISE REDUCTION BY INTEGRATING FREQUENCY-SPLIT SIGNALS WITH DIFFERENT TIME CONSTANTS

[75] Inventor: Yukinobu Ishigaki, Machida, Japan
[73] Assignee: Victor Company of Japan, Limited, Kanagawa, Japan
[21] Appl. No.: 434,850
[22] Filed: Oct. 18, 1982
[30] Foreign Application Priority Data Oct. 19, 1981 [JP] Japan .................................. 56-166603

[51] Int. Cl.³ .............................................. H04B 1/64
[52] U.S. Cl. ......................................... 455/72; 333/14; 381/94; 381/106
[58] Field of Search ........................ 455/43, 50, 63, 66, 455/70–72; 333/14; 179/1 P, 1 D, 1 VL; 360/24, 25, 69; 369/174, 175; 330/96, 101, 103, 109, 132, 281, 294; 370/7; 328/170

[56] References Cited

U.S. PATENT DOCUMENTS 3,798,562  3/1974  Takahashi et al. ..................... 330/28
4,177,356  12/1979  Jaeger et al. ..................... 179/1 P X Primary Examiner—Robert L. Griffin
Assistant Examiner—Albert W. Watkins
Attorney, Agent, or Firm—Lowe, King, Price & Becker

[57] ABSTRACT

A noise reduction circuit comprising first and second variable frequency amplifiers (3, 4; 12, 13) for respectively amplifying first and second audio signals at variable gains in response to a control signal, a frequency splitter (23–26; 42–45) for splitting each output signal of the first and second variable gain amplifiers into high and low frequency components, an envelope detector (27–30; 46–49) for detecting the envelopes of the high and low frequency components of each audio signal and generating therefrom first and second high frequency component envelopes and first and second low frequency component envelopes, a combining circuit (31, 32; 50, 51) for combining the first and second high frequency component envelopes to generate a combined high frequency output and combining the first and second low frequency component envelopes to generate a combined low frequency output, and means (33–35; 52–54) for integrating the combined high frequency output with a smaller time constant and integrating the combined low frequency output with a greater time constant and combining the integrated outputs to generate a signal as said control signal.

6 Claims, 4 Drawing Figures

NOISE REDUCTION BY INTEGRATING FREQUENCY-SPLIT SIGNALS WITH DIFFERENT TIME CONSTANTS

BACKGROUND OF THE INVENTION

The present invention relates to noise reduction by compression and expansion of original signals, and in particular to a noise reduction circuit which mitigates the problem associated with a phenomenon known as "breathing" caused by the modulation of a gain control signal on the noise introduced by a transmission or recording medium.

Noise reduction techniques have been extensively employed in recording to minimize the effect of noise generated in the recording material or introduced by a transmission medium by effecting the compression of the signal prior to recording or transmission and effecting the expansion of the reproduced or received signal. However, conventional noise reduction systems for multi-channel stereophony are still affected by the breathing phenomenon which is particularly acute when there is a phase difference of 180 degrees between the channels.

SUMMARY OF THE INVENTION

Accordingly, the present invention provides a noise reduction circuit for multi-channel stereophonic systems which mitigates the above-noted problems.

This object is obtained by separating the signal of each channel into high and low frequency components for separately integrating them with time constants optimal for the respective frequency range.

The present invention provides a compression circuit which comprises first and second variable frequency amplifiers for respectively amplifying first and second audio input signals at variable gains in response to a control signal, frequency splitting means for splitting each output signal of the first and second variable gain amplifiers into high and low frequency components, envelope detecting means for detecting the envelopes of the high and low frequency components of the signal derived from each of the variable gain amplifiers and generating therefrom first and second high frequency component envelopes and first and second low frequency component envelopes, combining means for combining the first and second high frequency component envelopes to generate a combined high frequency output and combining the first and second low frequency component envelopes to generate a combined low frequency output, and means for integrating the combined high frequency output with a smaller time constant and integrating the combined low frequency output with a greater time constant and combining the integrated outputs for application as the control signal to the first and second variable gain amplifiers, so that the audio input signals having smaller amplitudes are amplified at a higher gain than those having larger amplitudes.

The invention further provides an expansion circuit comprising first and second variable gain amplifiers for respectively amplifying first and second audio input signals at variable gains in response to a control signal, frequency splitting means for splitting each audio input signal to the first and second variable gain amplifiers into high and low frequency components, envelope detecting means for detecting the envelopes of the high and low frequency components of each audio input signal and generating therefrom first and second high frequency component envelopes and first and second low frequency component envelopes, combining means for combining the first and second high frequency component envelopes to generate a combined high frequency output and combining the first and second low frequency component envelopes to generate a combined low frequency output, and integrating means for integrating the combined high frequency output with a smaller time constant and integrating the combined low frequency output with a greater time constant and combining the integrated outputs for application as the control signal to the first and second variable gain amplifiers, so that the audio input signals having larger amplitudes are amplified at a higher gain than those having smaller amplitudes.

BRIEF DESCRIPTION OF THE DRAWINGS

The present invention will be described in further detail with reference to the accompanying drawings, in which.

DETAILED DESCRIPTION

Figure 1:
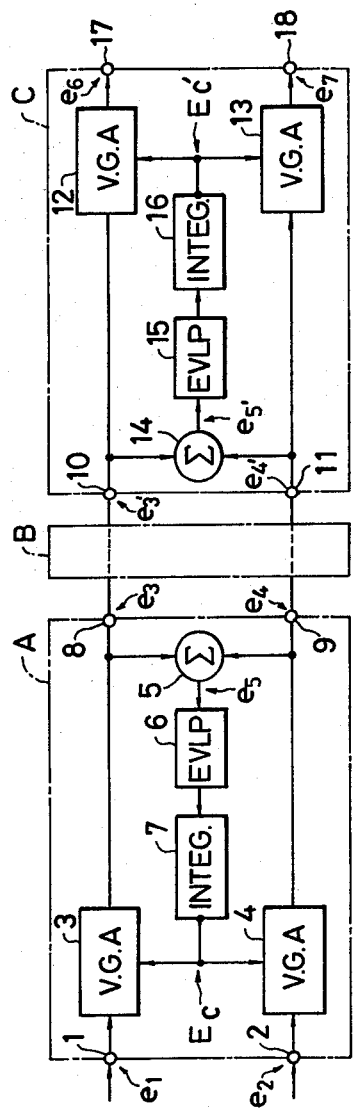
FIG. 1 is a block diagram of a prior art noise reduction system.

Before describing the detail of the present invention reference is first had to FIG. 1 in which a prior art two-channel noise reduction system is illustrated. The prior art system generally comprises a compression circuit A and an expansion circuit C interconnected by a two-channel transmission or recording medium B. Left and right channel audio signals $e_1$ and $e_2$ are applied through input terminals 1 and 2 to variable gain amplifiers 3 and 4, respectively, the amplified audio signals being applied as output signals $e_3$ and $e_4$ to terminals 8 and 9. The amplifiers 3 and 4 are gain-controlled by a control circuit including an adder 5 which adds up the outputs $e_3$ and $e_4$ to provide an output signal $e_5$ to an envelope detector 6, and an integrator 7 connected to the detector 6 to provide a gain control signal Ec to the amplifiers 3 and 4. These amplifiers are controlled so that the input signals having small amplitudes are amplified at a higher gain while those having higher amplitudes are amplified at a lower gain.

The gain-controlled signals $e_3$ and $e_4$ are supplied to the transmission or recording medium B. The transmitted or reproduced signals $e_3'$ and $e_4'$ at terminals 10, 11 of the medium B are applied to the expansion circuit C having an input-to-output characteristic complementary to the characteristic of the compression circuit A. The input signals $e_3'$ and $e_4'$ are applied to variable gain amplifiers 12 and 13, respectively, and also to an adder 14 providing a combined output $e_5'$, the combined output being applied to an envelope detector 15 and thence to an integrator 16 for providing a gain control signal $Ec'$ to the amplifiers 12 and 13. The amplifiers 12 and 13 are gain-controlled so that the input signals having smaller amplitudes are amplified at a lower gain while those having higher amplitudes are amplified at a higher gain, the outputs of the amplifiers 12, 13 being delivered to terminals 17, 18 as a replica of the input signals $e_1$ and $e_2$.

Figure 2:
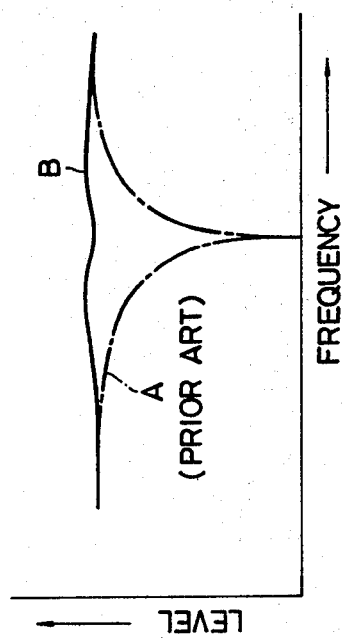
FIG. 2 is an illustration of an operating characteristic of the invention in comparison with the corresponding characteristic of the prior art system.

Although the prior art noise reduction system is effective in suppressing low level noise introduced by the transmission or recording medium B, there occurs a modulation noise due to a phenomenon known as "breathing" caused by the modulation of the gain control signal on the noise introduced by the medium B. While the modulation noise that occurs in response to the leading edge of the control signal $Ec'$ is masked by the subsequent relatively high level signal, the modulation signal that occurs in response to the trailing edge of the control signal is not masked by the subsequent relatively low level signal. This problem becomes acute when there is a phase difference of 180 degrees between the two channels due to the fact that since the control signal $Ec'$ is derived from the combined input signals $e_3'$ and $e_4'$ by integration with a single value of time constant, a large dip occurs in signal $Ec'$ as shown at A in FIG. 2 at a certain frequency where the left and right channel signals are displaced 180 degrees apart due to differences in operating parameters between the right and left channels, such as the magnetic gap-loss difference of transducer heads or the phase difference in high frequency range of the cutting and pickup styluses.

Figure 3:
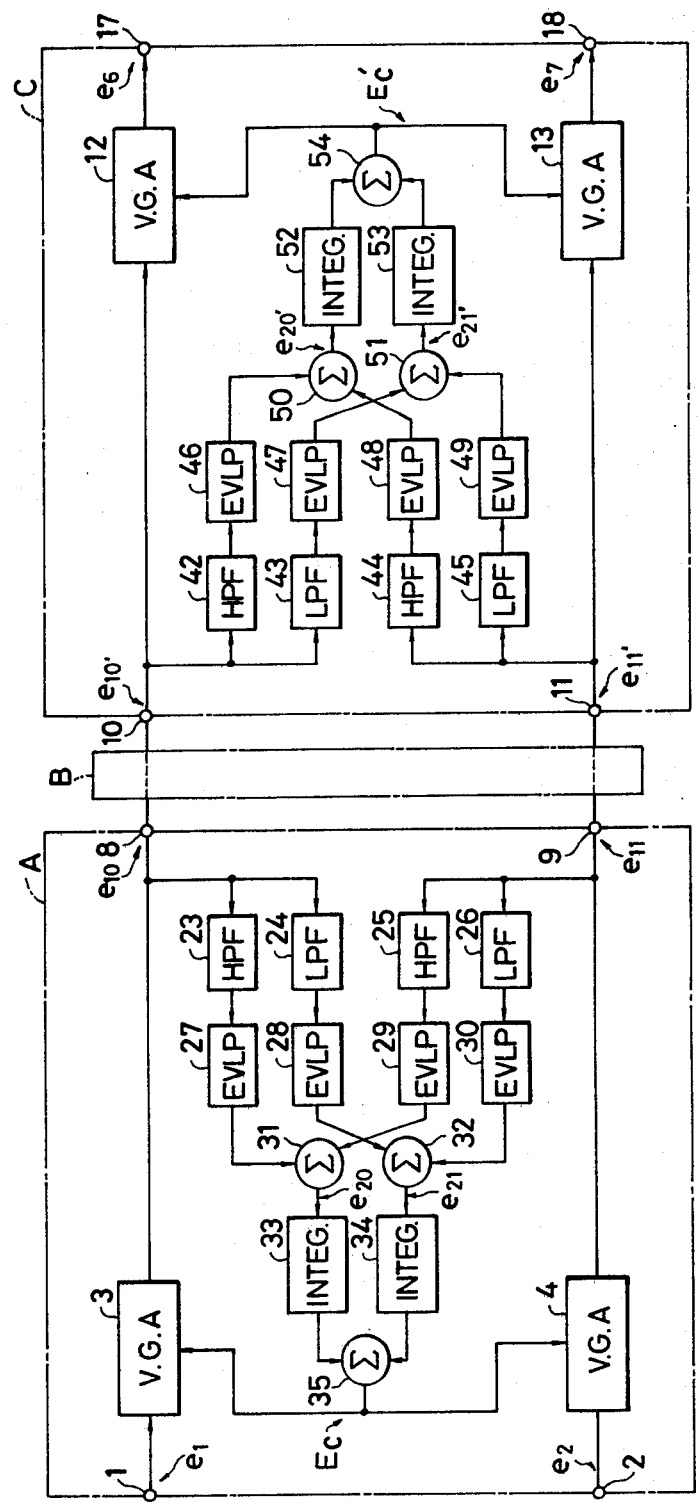
FIG. 3 is a block diagram of the noise reduction system of the invention.
Figure 4:
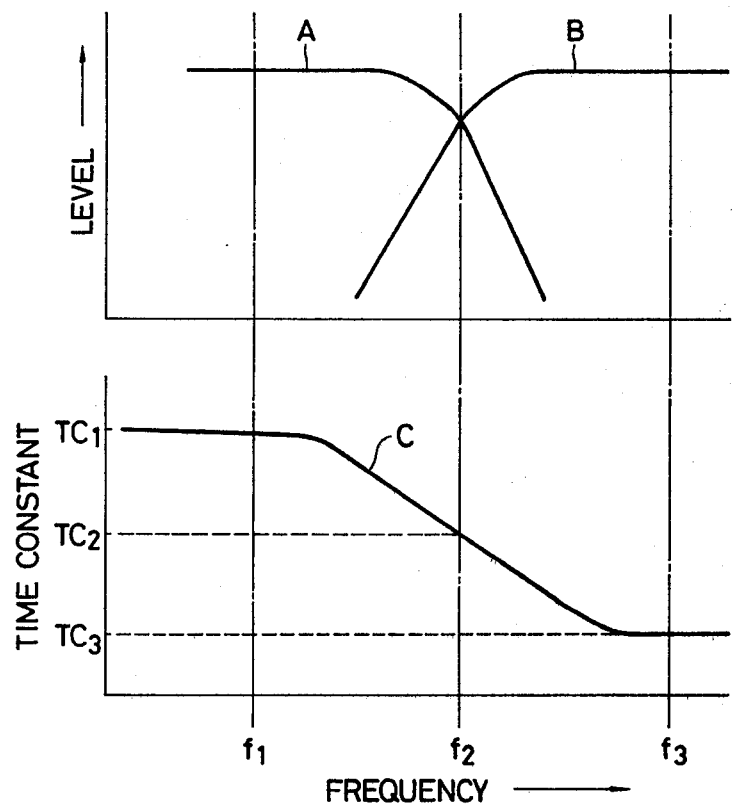
FIG. 4 is an illustration of the frequency response characteristics and attack and recovery time of the system of the invention.

FIG. 3 is a block diagram of a noise reduction system according to the invention in which parts corresponding to those in FIG. 1 are marked with the same symbols and numerals as in FIG. 1. The compression circuit A includes a gain control circuit which differs from the prior art compressor circuit by including for each channel a frequency splitter for separating the gain-controlled audio signal into high and low frequency components. The gain-controlled left channel signal $e_{10}$ is splitted in frequency by a high-pass filter 23 and a low-pass filter 24 having frequency response characteristics indicated at A and B, respectively, in FIG. 4, while the gain-controlled right channel signal $e_{11}$ is splitted by a high-pass filter 25 and a low-pass filter 26 having the same frequency response characteristics as those of the left channel filters 23 and 24. Envelope detectors 27 and 28 are coupled respectively to the outputs of high-pass and low-pass filters 23 and 24, and envelope detectors 29 and 30 are coupled respectively to the outputs of high-pass and low-pass filters 25 and 26. The envelope-detected high frequency components of the left and right channels are combined in an adder 31 providing a combined output $e_{20}$ and the envelope-detected low frequency components of the left and right channels are combined in an adder 32 providing an output $e_{21}$.

The high frequency output $e_{20}$ is applied to an integrator 33 having a small time constant value $TC_3$ which ranges from 200 miliseconds to 300 miliseconds optimum for high frequency audio signals, while the low frequency output $e_{21}$ is applied to an integrator 34 having a greater time constant value $TC_1$ which ranges from 20 miseonds to 30 miliseconds optimum for low frequency audio signals. The outputs of the integrators 33 and 34 are combined in an adder 35 to provide a gain control signal Eo to the amplifiers 3 and 4, providing gain-controlled output signals $e_{10}$ and $e_{11}$ to the transmission or recording medium B. As indicated at C in FIG. 4, the gain control circuit has a greater value of attack or recovery time $TC_1$ at lower audio frequencies $f_1$ than $TC_3$ at higher audio frequencies $f_3$, and has an intermediate value $TC_2$ at a crossover frequency $f_2$ which ranges from 500 Hz to 1000 Hz.

The expansion circuit C is a complementary circuit to the compression circuit A as in FIG. 1. The left channel input signal $e_{10}'$ is split in frequency by high-pass and low-pass filters 42 and 43 having the frequency response characteristics of FIG. 4 for applying the split components to envelope detectors 46 and 47, and the right channel input signal $e_{11}'$ is split in frequency by high-pass and low-pass filters 44 and 45 for applying the frequency split components to envelope detectors 48 and 49. An adder 50 combines the outputs of envelope detectors 46 and 48 and an adder 51 combines the outputs of envelope detectors 47 and 49. Integrators 52 and 53 having time constant values corresponding respectively to the integrators 33 and 34 are provided for integrating the combined high and low frequency components, respectively, the outputs of the integrators 52 and 53 being further combined in an adder 54 to provide a gain control signal $Eo'$ to the amplifiers 12 and 13.

Due to the optimization of time constant values for high and low frequency components of each audio signal, the the modulation noise is significantly reduced. Furthermore, due to the fact that the two channel signals are combined after their envelopes are respectively detected, the frequency spectrum of gain control signal $Eo'$ is substantially flat as indicated at B in FIG. 2.

It is seen that the noise reduction system as taught by the present invention utilizes a frequency splitter for separating the signal of each audio channel into different frequency components for individual integration with respective optimum values of time constant. Therefore, the modulation noise is significantly reduced even though the phase difference amounts to 180 degrees between the two channels.

What is claimed is:

1. A compression circuit comprising:

first and second variable gain amplifiers connected in first and second audio channels respectively for amplifying first and second audio signals each having frequency components in the audio spectrum at a variable gain in response to a common control signal applied thereto;

first frequency splitting means connected to be responsive to said first audio channel for splitting the output signal of said first variable gain amplifier into high and low frequency components and generating therefrom a first set of high and low frequency signals, and second frequency splitting means connected to be responsive to said second audio channel for splitting the output signal of said second variable gain amplifier into high and low frequency components and generating therefrom a second set of high and low frequency signals;

a first pair of envelope detecting means connected to be responsive to the outputs of said first frequency splitting means respectively for detecting the envelopes of said high and low frequency signals of said first set, and a second pair of envelope detecting means connected to be responsive to the outputs of said second frequency splitting means for detecting the envelopes of said high and low frequency signals of said second set;

first combining means for combining the detected envelopes of the high frequency signals of said first and second sets and generating is a combined high frequency output, and second combining means for combining the detected envelopes of the low frequency signals of said first and second sets and generating a combined low frequency output;

first integrator means for integrating said combined high frequency output with a first time constant, and second integrator means for integrating said combined low frequency output with a second time constant greater than the first time constant; and third combining means for combining the output signals of said first and second integrator means to generate said control signal.

2. A compression circuit as claimed in claim 1, wherein said first frequency splitting means comprises a first low-pass filter and a first high-pass filter having their inputs coupled together to the output of said first variable gain amplifier and said second frequency splitting means comprises a second low-pass filter identical to said first low-pass filter and a second high-pass filter identical to said first high-pass filter having their inputs coupled together to the output of said second variable gain amplifier.

3. An expansion circuit comprising:

first and second variable gain amplifiers connected in first and second audio channels respectively for amplifying first and second audio input signals each having frequency components in the audio spectrum at a variable gain in response to a common control signal applied thereto;

first frequency splitting means connected to be responsive to said first audio channel for splitting said first input audio signal into high and low frequency components and generating therefrom a first set of high and low frequency signals, said second frequency splitting means connected to be responsive to said second audio channel for splitting said second input audio signal into high and low frequency components and generating therefrom a second set of high and low frequency signals;

a first pair of envelope detecting means connected to be responsive to the outputs of said first frequency splitting means respectively for detecting the envelope of said high and low frequency signals of said first set, and a second pair of envelope detecting means connected to be responsive to the outputs of said second frequency splitting means respectively for detecting the envelope of said high and low frequency signals of said second set;

first combining means for combining the detected envelopes of the high frequency signals of said first and second sets and generating therefrom a combined high frequency output, and second combining means for combining the detected envelopes of the low frequency signals of said first and second sets and generating therefrom a combined low frequency output;

first integrator means for integrating said combined high frequency output with a first time constant, and second integrator means for integrating said combined low frequency output with a second time constant greater than the first time constant; and third combining means for combining the output signals of said first and second integrator means to generate said control signal.

4. An expansion circuit as claimed in claim 3, wherein said first frequency splitting means comprises a first low-pass filter and a first high-pass filter having their inputs coupled together to the input of said first variable gain amplifier and said second frequency splitting means comprises a second low-pass filter identical to said first low-pass filter and a second high-pass filter identical to said first high-pass filter having their inputs coupled together to the input of said second variable gain amplifier.

5. A noise reduction system having a pair of first and second audio channels between first and second ends, comprising:

a compression circuit at said first end including: first and second variable gain amplifiers connected in said first and second channels respectively for amplifying first and second audio signals each having frequency components in the audio spectrum at a variable gain in response to a first common control signal applied thereto and generating first and second gain-controlled audio output signals;

first frequency splitting means connected to be responsive to said first audio channel for splitting the output signal of said first variable gain amplifier into high and low frequency components and generating therefrom a first set of high and low frequency signals, and second frequency splitting means connected to be responsive to said second audio channel for splitting the output signal of said second variable gain amplifier into high and low frequency components and generating therefrom a second set of high and low frequency signals;

a first pair of envelope detecting means connected to be responsive to the outputs of said first frequency splitting means respectively for detecting the envelopes of said high and low frequency signals of said first set, and a second pair of envelope detecting means connected to be responsive to the outputs of said second frequency splitting means for detecting the envelopes of said high and low frequency signals of said second set;

first combining means for combining the detected envelopes of the high frequency signals of said first and second sets and generating a first combined high frequency output, and second combining means for combining the detected envelopes of the low frequency signals of said first and second sets and generating a first combined low frequency output;

first integrator means for integrating said combined high frequency output with a first time constant, and second integrator means for integrating said combined low frequency output with a second time constant greater than the first time constant; and means for combining the output signals of said first and second integrator means to generate said first control signal; and an expansion circuit at said second end including:

third and fourth variable gain amplifiers connected in said first and second channels respectively for amplifying said gain-controlled first and second audio output signals at a variable gain in response to a second common control signal applied thereto and generating a pair of output signals for application to a utilization means;

third frequency splitting means connected to be responsive to said first channel for splitting said first audio output signal into high and low frequency components and generating therefrom a fourth set of high and low frequency signals;

a third pair of envelope detecting means connected to be responsive to the outputs of said third frequency splitting means respectively for detecting the envelope of said high and low frequency signals of said third set, and a fourth pair of envelope detecting means connected to be responsive to the outputs of said fourth frequency splitting means respectively for detecting the envelope of said high and low frequency signals of said fourth set;

third combining means for combining the detected envelopes of the high frequency signals of said third and fourth sets and generating therefrom a second combined high frequency output, and fourth combining means for combining the detected envelopes of the low frequency signals of said third and fourth sets and generating therefrom a second combined and low frequency output;

third integrator means for integrating said second combined high frequency output with a smaller time constant, and fourth integrator means for integrating said second combined low frequency output with a greater time constant; and means for combining the output signals of said third and fourth integrator means to generate said second control signal.

6. A noise reduction system as claimed in claim 5, wherein said first frequency splitting means comprises a first low-pass filter and a first high-pass filter having their inputs coupled together to said first audio channel at the output of said first variable gain amplifier and said second frequency splitting means comprises a second low-pass filter identical to said first low-pass filter and a second high-pass filter identical to said first high-pass filter having their inputs coupled together to said second audio channel at the output of said second variable gain amplifier, and wherein said third frequency splitting means comprises a third low-pass filter and a third high-pass filter having their inputs coupled together to said first audio channel at the input of said third variable gain amplifier and said fourth frequency splitting means comprises a fourth low-pass filter identical to said third low-pass filter and a fourth high-pass filter identical to said third high-pass filter having their inputs coupled together to said second audio channel at the input of said fourth variable gain amplifier.

* * * * *